(12) United States Patent
Sato et al.

(10) Patent No.: US 7,477,671 B2
(45) Date of Patent: Jan. 13, 2009

(54) SURFACE-EMITTING TYPE SEMICONDUCTOR LASER

(75) Inventors: Atsushi Sato, Horigane-mura (JP); Masamitsu Mochizuki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/242,005

(22) Filed: Oct. 4, 2005

(65) Prior Publication Data
US 2006/0098706 A1 May 11, 2006

(30) Foreign Application Priority Data
Nov. 9, 2004 (JP) ............................. 2004-324913

(51) Int. Cl.
*H01S 5/00* (2006.01)
(52) U.S. Cl. .............................. 372/50.124; 372/43.01; 372/46.013; 372/38.05
(58) Field of Classification Search ............ 372/50.124, 372/45.01, 99, 102
See application file for complete search history.

(56) References Cited

U.S. PATENT DOCUMENTS

| 5,245,622 | A | * | 9/1993 | Jewell et al. | ............. | 372/45.01 |
| 6,519,271 | B2 | * | 2/2003 | Kwon et al. | ............. | 372/46.01 |
| 6,798,810 | B2 | * | 9/2004 | Albrecht | ................ | 372/45.01 |
| 6,816,527 | B2 | * | 11/2004 | Ueki | ...................... | 372/46.01 |
| 2003/0026308 | A1 | * | 2/2003 | Iwai et al. | .................... | 372/46 |
| 2003/0053501 | A1 | * | 3/2003 | Sekiya et al. | ................ | 372/43 |
| 2003/0086463 | A1 | * | 5/2003 | Shin et al. | .................... | 372/46 |

FOREIGN PATENT DOCUMENTS

| JP | A 2002-208755 | 7/2002 |
| JP | A 2004-063707 | 2/2004 |

* cited by examiner

*Primary Examiner*—Minsun Harvey
*Assistant Examiner*—Xnning Niu
(74) *Attorney, Agent, or Firm*—Oliff & Berridge, PLC (57) ABSTRACT

To provide a surface-emitting type semiconductor laser that is capable of emitting a laser beam with a narrower radiation angle. A surface-emitting type semiconductor laser in accordance with the present invention includes: a substrate 110; a first mirror 142 provided above the substrate 110; an active layer 144 provided above the first mirror 142; a second mirror 146 provided above the active layer 144; an electrode 122 provided above the second mirror 146; and an emission surface 126 among the second mirror 146, which is not covered by the electrode 122, wherein the electrode 122 has a film thickness D that satisfies a formula (1) as follows, $(4i+1)\lambda/8n \leq D \leq (4i+3)\lambda/8n$ ... (1) where, in the formula (1), i is an integer, $\lambda$ is an oscillation wavelength, and n is a refractive index of a material that covers the emission surface.

8 Claims, 6 Drawing Sheets

SURFACE-EMITTING TYPE SEMICONDUCTOR LASER

This application claims the benefit of Japanese Patent Application No. 2004-324913 filed Nov. 9, 2004. The entire disclosure of the prior application is hereby incorporated by reference herein its entirety.

BACKGROUND

The present invention relates to surface-emitting type semiconductor lasers.

A surface-emitting type semiconductor laser is a semiconductor laser that emits a laser beam perpendicular to a semiconductor substrate, and because its in-process examination is easier than an edge-emitting type semiconductor laser, and its radiation pattern is circular, it is highly expected as a variety of sensors and light sources for optical communications. When a surface-emitting type semiconductor laser is used as a sensor or a light source for optical communications, it is desirous to obtain a laser beam having a radiation pattern with a narrow radiation angle.

As a technology for reducing the radiation angle, Japanese Laid-open Patent Application 2004-63707 discloses a method in which the size of an aperture of a current constricting section is made smaller than the size of an aperture of an emission surface for reducing the radiation angle. Also, Japanese Laid-open Patent Application 2002-208755 discloses a technique for designing an aperture diameter of a current constricting section and an aperture diameter of a laser emission area in a manner that a difference between the optical loss of a high mode and the optical loss of a lower mode becomes large.

[Patent Document 1] Japanese Laid-open Patent Application 2004-63707

[Patent Document 2] Japanese Laid-open Patent Application 2002-208755

It is an object of the present invention to provide a surface-emitting type semiconductor laser that is capable of emitting a laser beam with a narrower radiation angle.

A surface-emitting type semiconductor laser comprising:
a substrate;
a first mirror provided above the substrate;
an active layer provided above the first mirror;
a second mirror provided above the active layer;
an electrode provided above the second mirror; and
an emission surface among the second mirror, which is not covered by the electrode, wherein the electrode has a film thickness D that satisfies a formula (1) as follows.

$$(4i+1)\lambda/8n \leq D \leq (4i+3)\lambda/8n \tag{1}$$

(In the formula (1), i is an integer, $\lambda$ is an oscillation wavelength, and n is a refractive index of a material that covers the emission surface.)

According to the surface-emitting type semiconductor laser in accordance with the present invention, the radiation angle of a laser beam can be made smaller. This effect can be obtained by setting the film thickness of the electrode provided above the second mirror in the range described above. The inventors in the present application discovered that the radiation angle of a laser beam periodically changes, and there is a correlation between the radiation angle and the film thickness of an electrode. Concretely, in examining the correlation between the radiation angle and the film thickness of an electrode, it was found that the radiation angle changed in a cycle of $\lambda/2$ with respect to the thickness of the electrode. Its details are described below. Thus, according to the present invention, because the range of the film thickness of electrodes is set based on such a consideration, a surface-emitting type semiconductor laser with a smaller radiation angle of a laser beam can be provided.

In the surface-emitting type semiconductor laser in accordance with the present invention, a specific object (hereafter referred to as "B") provided "above" another specific object (hereafter referred to as "A") includes B provided directly on A, and B provided above A through another object on A.

The present invention can be further implemented in the following embodiments.

The surface-emitting type semiconductor laser in accordance with the present invention may further include a dielectric film that covers at least an upper end section of the electrode on an emission surface side.

According to this embodiment, concentration of an electric field at the upper end section of the electrode on the emission surface side can be suppressed. Therefore, distortion of the mode of a laser beam emitted at the upper end section of the electrode that forms the emission surface can be suppressed. Distortion of the mode becomes a cause of an increase in the radiation angle. However, according to the present invention, the distortion of the mode can be suppressed by suppressing concentration of the electric field at the upper end section of the electrode. As a result, a surface-emitting type semiconductor laser that achieves a reduced radiation angle can be provided.

In the surface-emitting type semiconductor laser in accordance with the present invention, wherein the dielectric film may cover the upper end section of the electrode on the emission surface side, and may further be provided above at least a portion of the emission surface, and the dielectric film that is present above the emission surface may have a film thickness D' that is defined by a formula (2) as follows.

$$D'=(2i+1)\lambda/4n' \tag{2}$$

(In the formula (2), i is an integer, $\lambda$ is an oscillation wavelength, and n' is a refractive index of the dielectric.)

In accordance with this embodiment, the dielectric film is provided further to cover a portion of the emission surface. For example, when an optical fiber is connected to a laser, and after a laser beam is emitted, there may be light that is reflected on and turns from the fiber. The returning light may give noise to the emission light. However, according to the present embodiment, by setting the film thickness of the dielectric film provided above the emission surface in the range described above, such a problem can be suppressed. As a result, a surface-emitting type semiconductor laser with excellent characteristics can be provided.

In the surface-emitting type semiconductor laser in accordance with the present invention, the electrode may be formed from a plurality of divided electrodes, wherein the plurality of divided electrodes may be disposed such that a line connecting end faces thereof on the emission surface side defines a ring shape.

According to this embodiment, a part of the divided electrodes may be made to be an electrode that does not contribute to current injection, and can be made as a spare electrode, an electrode of another device that is connected to the surface-emitting type semiconductor laser or the like.

In the surface-emitting type semiconductor laser in accordance with the present invention, at least a portion of an end section of a cross section of the electrode on the emission surface side may be a curve (composed of a curve).

According to the present embodiment, because the cross-sectional shape of the upper end section of the electrode on the emission surface side is a curve, concentration of the electric field can be suppressed. As a result, effects similar to those of the above-described embodiment in which a dielectric film is provided can be obtained, and thus a surface-emitting type semiconductor laser with a reduced radiation angle can be provided.

The surface-emitting type semiconductor laser in accordance with the present invention may have a current constricting section above the active layer, wherein a diameter of an aperture defined by the current constricting section may be made smaller than a diameter of the emission surface.

In the surface-emitting type semiconductor laser in accordance with the present invention, the aperture may be positioned inside the emission surface as viewed in a plan view, wherein a difference $\Delta R$ between the diameter of the aperture and the diameter of the emission surface may be a value that satisfies a formula (3) as follows.

$$\Delta R \geq d \times \tan(\theta/2) \quad (3)$$

(In the formula (3), d is a distance from the active layer to the emission surface, and $\theta$ is an angle of broadening of light generated from the active layer.)

The surface-emitting type semiconductor laser in accordance with the present invention may further include a contact layer provided between the second mirror and the electrode.

According to this embodiment, because the contact layer is provided, current injection can be effectively conducted.

DETAILED DESCRIPTION OF EMBODIMENTS

Examples of embodiments of the present invention are described below.

1. Embodiments 1.1. Surface-Emitting Type Semiconductor Laser

Figure 1:
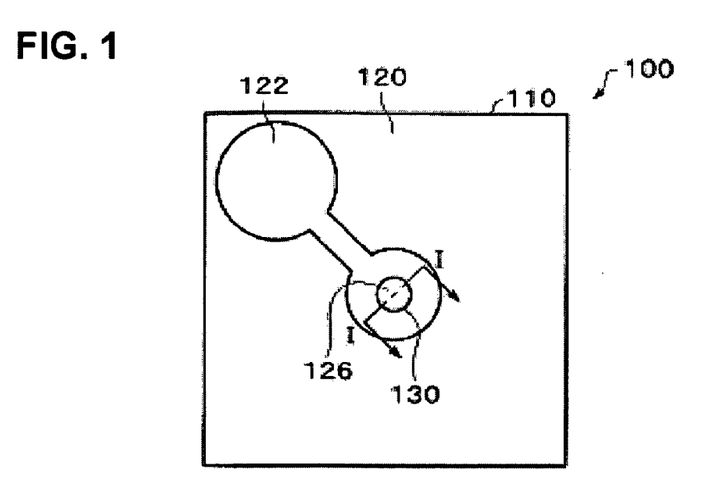
FIG. 1 is a plan view schematically showing a surface-emitting type semiconductor laser in accordance with an embodiment.
Figure 2:
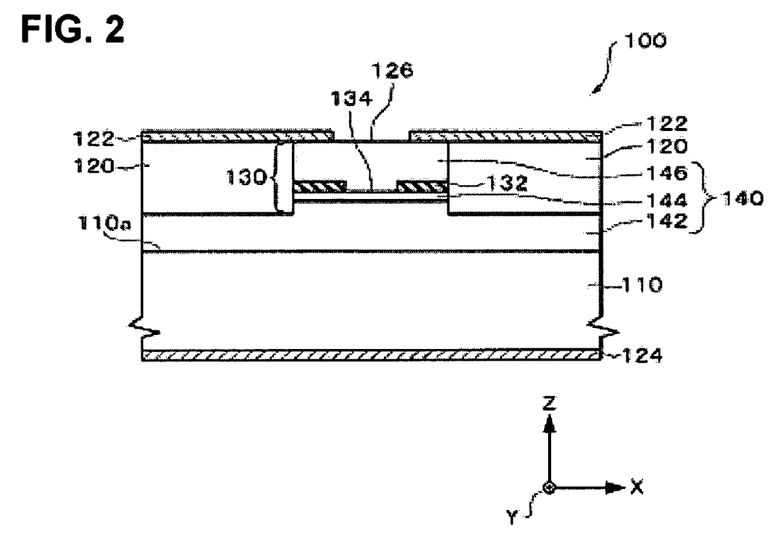
FIG. 2 is a view showing a cross section taken along a line I-I of FIG. 1.

First, a structure of a surface-emitting type semiconductor laser in accordance with an embodiment is described with reference to FIGS. 1 and 2. FIG. 1 is a plan view of a surface-emitting type semiconductor laser in accordance with a first embodiment of the present invention. FIG. 2 is a cross-sectional view of the surface-emitting type semiconductor laser in accordance with the present embodiment, which is a cross-sectional view taken along a line I-I of FIG. 1.

As shown in FIG. 1 and FIG. 2, the surface-emitting type semiconductor laser 100 of the present embodiment includes a semiconductor substrate (a GaAs substrate in the present embodiment) 110, a vertical resonator (hereafter referred to as a "resonator") 140 formed on the semiconductor substrate 110, a first electrode 122, and a second electrode 124. The resonator 140 includes a first mirror 142, an active layer 144 and a second mirror 146.

Next, each component of the surface-emitting type semiconductor laser 100 is described.

First, the resonator 140 is described. The resonator 140 has the first mirror 142, the active layer 144 and the second mirror 146, as described above. As the first mirror 142, for example, a distributed Bragg reflection type mirror (DBR) of 40 pairs of alternately laminated n-type $Al_{0.9}Ga_{0.1}As$ layers and n-type $Al_{0.15}Ga_{0.85}As$ layers can be used. The active layer 144 may be composed of GaAs well layers and $Al_{0.3}Ga_{0.7}As$ barrier layers in which the well layers include a quantum well structure composed of three layers. As the second mirror 146, a distributed Bragg reflection type mirror (DBR) composed of a semiconductor multilayer film of 25 pairs of alternately laminated p-type $Al_{0.9}Ga_{0.1}As$ layers and p-type $Al_{0.15}Ga_{0.85}As$ layers can be used. It is noted that the composition of each layer and the number of layers in the first mirror 142, the active layer 144 and the second mirror 146 may not be limited to the above.

The second mirror 146 is made to be p-type by doping, for example, C, Zn or Mg, and the first mirror 142 is made to be n-type by doping, for example, Si or Se. Accordingly, a pin diode is formed with the second mirror 146, the active layer 144 in which no impurity is doped, and the first mirror 142.

The second mirror 146, the active layer 144 and a part of the first mirror 142 compose a columnar semiconductor deposited body (also referred to as a "columnar section") 130. A side surface of the columnar section 130 is covered by an embedding dielectric layer 120.

A dielectric layer 132 that functions as a current constricting layer may be formed in a region near the active layer 144 among the layers composing the columnar section 130. The dielectric layer 132 may have a ring shape along the circumference of the columnar section 130. Also, the dielectric layer 132 for current constriction may be composed of, for example, aluminum oxide.

In the surface-emitting type semiconductor laser 100 in accordance with the present embodiment, an embedding dielectric layer 120 is formed in a manner to cover side surfaces of the columnar section 130. A dielectric material composing the embedding dielectric layer 120 may be any one of a variety of glasses, oxides of metals or resins. For example, polyimide resin, fluorine resin, acrylic resin, epoxy resin, etc. can be used as the resin. In particular, the resin may preferably be polyimide resin or fluorine resin in view of their easiness of processing and nonconductivity.

The first electrode 122 is formed on the columnar section 130 and the embedding dielectric layer 120. The first electrode 122 consists of a laminated film of, for example, Au and an alloy of Au and Zn. An aperture section in the first electrode 122 on the columnar section 130 defines an emission surface 126 of a laser beam. The diameter of the emission surface 126 is greater than the diameter of the aperture 134 defined by the dielectric layer 132 that is the current constricting layer. Concretely, as viewed in a plan view, the aperture 134 is located inside the emission surface 126, and a difference $\Delta R$ between the diameter of the aperture 134 and the diameter of the emission surface 126 may preferably be a value that satisfies a formula (3) shown below, and may be a value smaller than those that can secure a current flowing toward the current constricting section.

$$\Delta R \geq d \times \tan(\theta/2) \quad (3)$$

(In the formula (3), d is a distance from the active layer to the emission surface, and $\theta$ is an angle of broadening of light generated from the active layer.) It is noted that the difference in diameter may not precisely be a difference in radius or the like, but the closest distance between the inner edge of the current constricting layer and the inner edge of the electrode.

Also, the first electrode 122 has a film thickness D in a range defined by a formula (1) shown below.

$$(4i+1)\lambda/8n \leq D \leq (4i+3)/8n \quad (1)$$

(In the formula (1), i is an integer, $\lambda$ is an oscillation wavelength, and n is a refractive index of a material that covers the emission surface. In FIG. 2, n is 1 that is a refractive index of air.)

Figure 3:
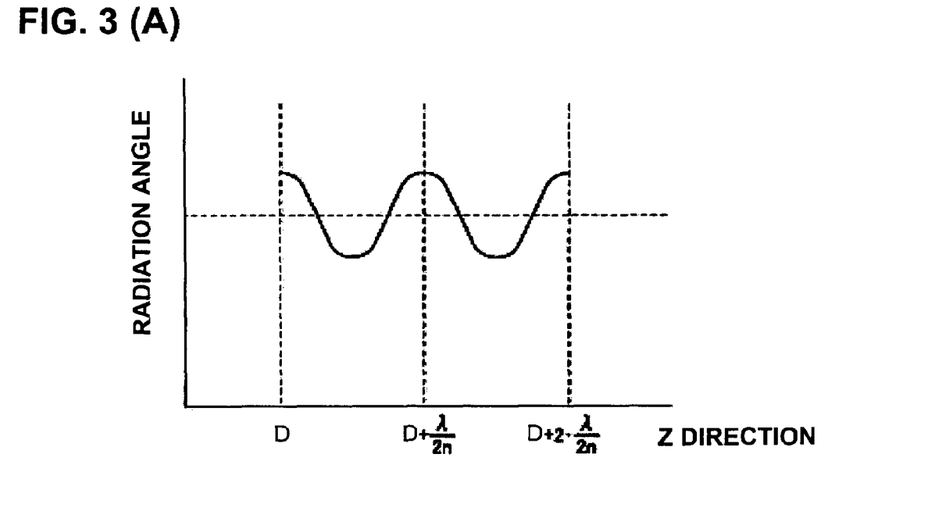
FIG. 3 are graphs showing simulation results.

Here, advantages provided by the film thickness in the above-described range are described with reference to FIG. 3. In FIGS. 3 (A) and (B), the film thickness of electrodes is shown along an axis of abscissa, and the radiation angle of laser beams is shown along an axis of ordinate. FIG. 3 (A) is a graph showing the relation between the film thickness of electrodes and the radiation angle of laser beams, and FIG. 3 (B) is a graph showing the relation between the film thickness of electrodes whose film thickness D is in a range of $0<D \leq \lambda/2n$ and the radiation angle of laser beams. It is noted that the results of radiation angles shown in FIG. 3 (A) and FIG. 3 (B) are obtained by a finite-difference time-domain (FDTD) method. The inventors in the present application found that, as shown in FIG. 3 (A), the radiation angle of a laser beam changed in a generally regular cycle with respect to the film thickness of an electrode. Concretely, the radiation angle changes in a cycle of $\lambda/2n$. Further, it was found that the film thickness that gave the minimum radiation angle changed within a constant range with "$\lambda$(oscillation wavelength)/4n" as a center. Then, it was examined as to how the minimum values of the radiation angle would change when the film thickness of electrodes was within a range of $0<D \leq \lambda/2n$. The results are shown in FIG. 3 (B). As seen from FIG. 3 (B), it was found that the position at which the radiation angle became the minimum changed when the film thickness D of electrodes was within a range of $\lambda/8n \leq D \leq 3\lambda/8n$. According to the above simulation results, by designing the film thickness of the first electrode 122 within the range defined by the above formula (1), the radiation angle of a laser beam can be made small.

Moreover, the second electrode 124 is formed on a back surface of the semiconductor substrate 110. The second electrode 124 may be composed of a laminated film of, for example, Au and an alloy of Au and Ge. In other words, in the surface-emitting type semiconductor laser 100 shown in FIG. 1 and FIG. 2, the first electrode 122 connects to the second mirror 146 on the columnar section 130, and the second electrode 124 connects to the semiconductor substrate 110. A current is injected to the active layer 144 by the first electrode 122 and the second electrode 124.

The materials to form the first electrode 122 and the second electrode 127 are not limited to those described above, but a metal, such as, for example, Cr, Ti, Ni, Au, and Pt, an alloy thereof, or a combination of them (laminated layers) can be used depending on the requirements for adhesion reinforcement, diffusion prevention, oxidation prevention and the like.

1. 2. Operation of Device

General operations of the surface-emitting semiconductor laser 100 of the present embodiment are described below. It is noted that the following method for operating the surface-emitting type semiconductor laser 100 is described as an example, and various changes can be made without departing from the subject matter of the present invention.

When applying a voltage in a forward direction to the pin diode by the first electrode 122 and the second electrode 124, recombinations of electrons and holes occur in the active layer 144, thereby causing emission of light due to the recombinations. Stimulated emission occurs during the period the generated light reciprocates between the second mirror 146 and the first mirror 142, whereby the light intensity is amplified. When the optical gain exceeds the optical loss, laser oscillation occurs, whereby a laser beam is emitted from the emission surface 126 at the upper surface of the columnar section 130 in a direction perpendicular to the semiconductor substrate 110.

1. 3. Method for Manufacturing Surface-Emitting Laser

Next, an example of the method for manufacturing the surface-emitting type semiconductor laser 100 shown in FIG. 1 and FIG. 2 is described with reference to FIG. 4 through FIG. 7. FIG. 4 through FIG. 7 are cross-sectional views schematically showing a process for manufacturing the surface-emitting type semiconductor laser 100 shown in FIG. 1 and FIG. 2, each of which corresponds to the cross-sectional view shown in FIG. 2.

Figure 4:
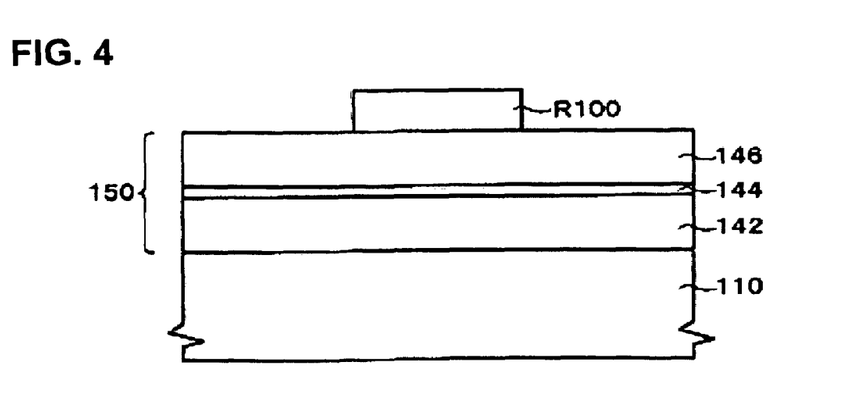
FIG. 4 is a cross-sectional view schematically showing a step of manufacturing the surface-emitting type semiconductor laser shown in FIGS. 1 and 2.

(1) First, as shown in FIG. 4, on the surface of the semiconductor substrate 110 composed of n-type GaAs, a semiconductor multilayer film 150 is formed by epitaxial growth while varying the composition. It is noted here that the semiconductor multilayer film 150 is formed from, for example, a first mirror 142 of 40 pairs of alternately laminated n-type $Al_{0.9}Ga_{0.1}As$ layers and n-type $Al_{0.15}Ga_{0.85}As$ layers, an active layer 144 composed of GaAs well layers and $Al_{0.3}Ga_{0.7}As$ barrier layers in which the well layers include a quantum well structure composed of three layers, and a second mirror 146 of 25 pairs of alternately laminated p-type $Al_{0.9}Ga_{0.1}As$ layers and p-type $Al_{0.15}Ga_{0.85}As$ layers. These layers are successively laminated on the semiconductor substrate 110 to thereby form the semiconductor multilayer film 150.

The uppermost layer in the second mirror 146 may preferably be formed from a p-type $Al_{0.9}Ga_{0.1}As$ layer of a lower refractive index. Also, in the second mirror 146, the p-type $Al_{0.9}Ga_{0.1}As$ layers may be replaced with AlAs layers.

When growing the second mirror 146, at least one layer adjacent to the active layer 144 is formed as an AlAs layer or an AlGaAs layer that becomes a dielectric layer 132 for current constriction when oxidized later. Al composition of the AlGaAs layer that becomes the dielectric layer 132 is 0.95 or greater. Also, the layer at the uppermost surface of the second mirror 146 may preferably be formed to have a high carrier density, such that an ohmic contact can be readily made with an electrode (the first electrode 122).

The temperature at which the epitaxial growth is conducted is appropriately decided depending on the growth method, the kind of raw material, the type of the semiconductor substrate 110, and the kind, thickness and carrier density of the semiconductor multilayer film 150 to be formed, and in general may preferably be 450° C.-800° C. Also, the time required for conducting the epitaxial growth is appropriately decided just like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Then, resist is coated on the semiconductor multilayer film 150, and then the resist is patterned by a lithography method, thereby forming a resist layer R100 having a specified pattern, as shown in FIG. 4. The resist layer R100 is formed above an area where a columnar section 130 (see FIG. 1 and FIG. 2) is planned to be formed.

Figure 5:
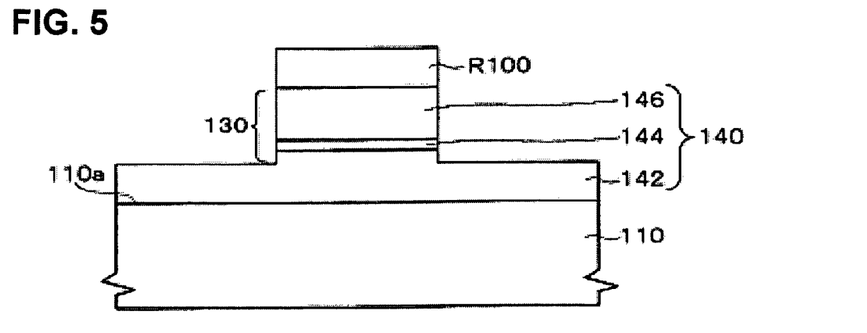
FIG. 5 is a cross-sectional view schematically showing a step of manufacturing the surface-emitting type semiconductor laser shown in FIGS. 1 and 2.

(2) Then, the second mirror 146, the active layer 144 and a part of the first mirror 142 are etched by, for example, a dry etching method, using the resist layer R100 as a mask, whereby a columnar semiconductor deposited body (columnar section) 130 is formed. Then, the resist R100 is removed.

Figure 6:
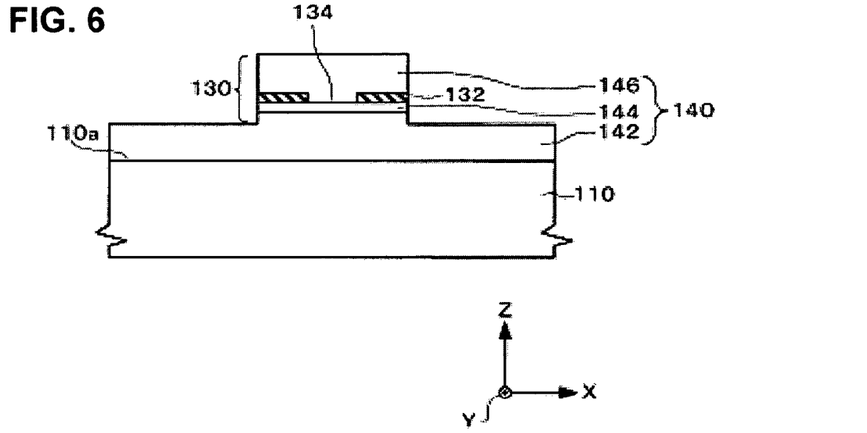
FIG. 6 is a cross-sectional view schematically showing a step of manufacturing the surface-emitting type semiconductor laser shown in FIGS. 1 and 2.

(3) Next, as shown in FIG. 6, by placing the semiconductor substrate 110 on which the columnar section 130 is formed through the aforementioned steps in a water vapor atmosphere at about 400° C., for example, a layer having a high Al composition (a layer with an Al composition being 0.95 or higher) provided in the above-described second mirror 146 is oxidized from its side surface, thereby forming the dielectric layer 132 for current constriction. The oxidation rate depends on the furnace temperature, the amount of water vapor that is supplied, and the Al composition and the film thickness of the layer to be oxidized.

Figure 7:
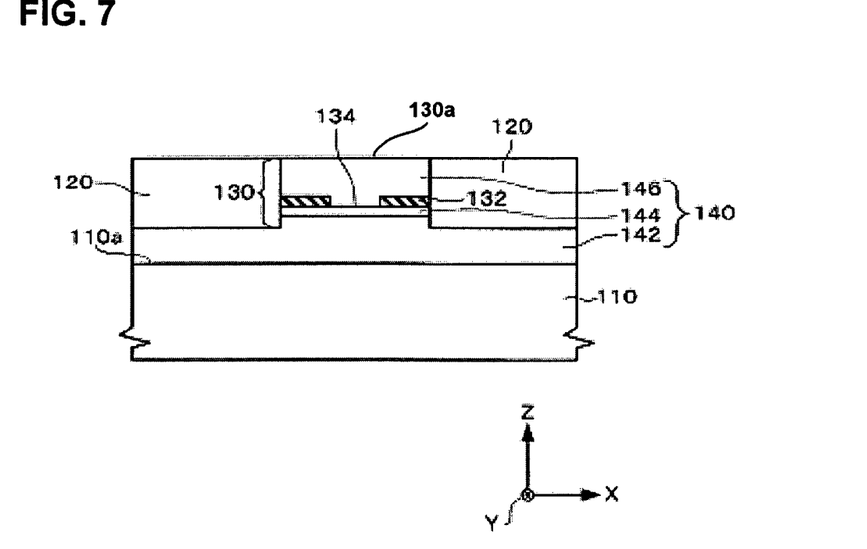
FIG. 7 is a cross-sectional view schematically showing a step of manufacturing the surface-emitting type semiconductor laser shown in FIGS. 1 and 2.

(4) Next, as shown in FIG. 7, an embedding dielectric layer 120 that embeds the columnar section 130, in other words, a part of the first mirror 142, the active layer 144 and the second mirror 146.

Here, an example in which polyimide resin is used as a material for forming the embedding dielectric layer 120 is described. First, a precursor (polyimide precursor) is coated on the semiconductor substrate 110 having the columnar section 130 by using, for example, a spin coat method, to thereby form a precursor layer. In this instance, the precursor layer is formed such that its film thickness becomes greater than the height of the columnar section 130. As the method of forming the precursor layer, besides the aforementioned spin coat method, another known technique, such as, a dipping method, a spray coat method, a droplet discharge method or the like can be used.

Then, the semiconductor substrate 110 is heated by using, for example, a hot plate or the like, thereby removing solvent from the precursor layer, and then semi-dried at about 200° C. Then, as shown in FIG. 7, after exposing an upper surface 130a of the columnar section 130, the semiconductor substrate is placed in a furnace at about 350° C. to imidize the precursor layer, thereby forming an embedding dielectric layer 120 that is almost completely hardened. As a method for exposing the upper surface 130a of the columnar section 130, a CMP method, a dry etching method, a wet etching method or the like can be used. Also, the embedding dielectric layer 120 may be formed with a resin that has photosensitivity. The embedding dielectric layer 120 or a layer at each stage leading to hardening may be patterned by lithography or the like depending on the requirements.

(5) Next, the steps of forming a first electrode 122 and a second electrode 124 for injecting an electric current into the active layer 144, and an emission surface 126 of laser light are described.

Prior to forming the first electrode 122 and the second electrode 124, exposed upper surfaces of the columnar section 130 and the semiconductor substrate 110 are washed by using a plasma treatment method, or the like depending on the requirements. As a result, a device with more stable characteristics can be formed. Then, for example, a patterned resist layer and a multilayer film of Au and an alloy of Au and Zn, for example, is formed by, for example, a vacuum deposition method on the upper surface of the embedding dielectric layer 120 and the columnar section 130, and then a portion where the multilayer film is not formed is formed on the upper surface of the columnar section 130 by a lift-off method, as shown in FIG. 2. This portion becomes an emission surface 126. It is noted that, in the above step, a dry etching method or a wet etching method can be used instead of the lift-off method. In this instance, the first electrode 122 is formed to be within the desired range, as described in the section 1. 1.

Also, a multilayer film of Au and an alloy of Au and Ge, for example, is formed by, for example, a vacuum deposition method on the exposed upper surface of the semiconductor substrate 110. Next, an annealing treatment is conducted. The temperature of the annealing treatment depends on the electrode material. This is usually conducted at about 400° C. for the electrode material used in the present embodiment. By the steps described above, the first electrode 122 and the second electrode 124 are formed.

According to the surface-emitting type semiconductor laser of the present embodiment, the radiation angle of a laser beam can be made smaller. As a result, a surface-emitting type semiconductor laser with excellent characteristics can be provided.

2. MODIFIED EXAMPLES

A variety of modifications can be made, without being limited to the embodiment described above, in the surface-emitting laser of the present embodiment within the range of the subject matter of the present invention. Examples of such modified examples are described below.

2. 1. Modified Example 1

Figure 8:
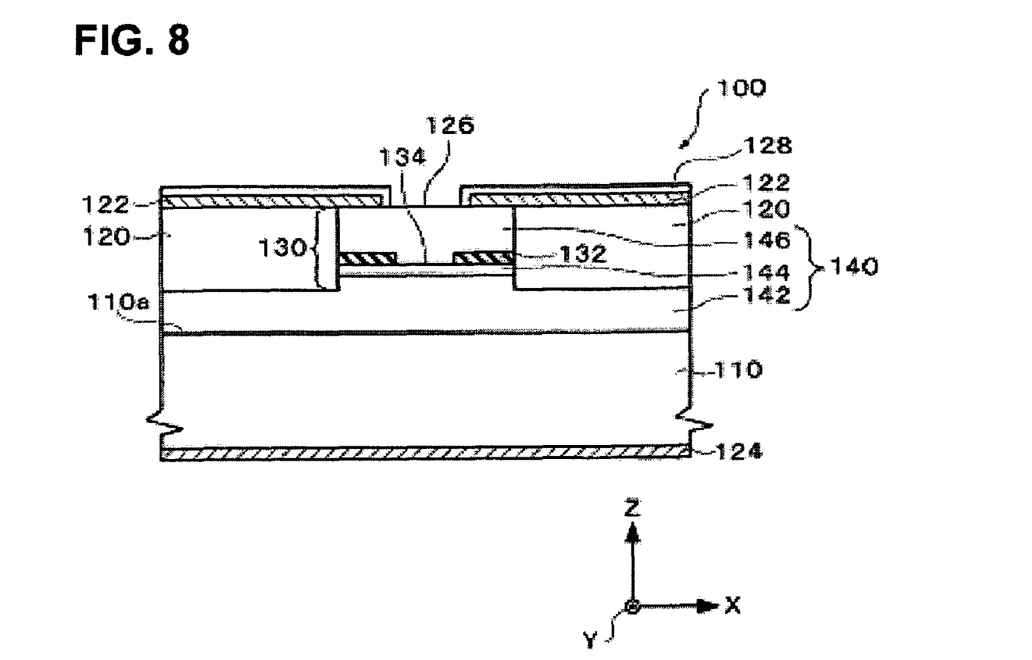
FIG. 8 is a plan view schematically showing a surface-emitting type semiconductor laser in accordance with Modified Example 1.
Figure 9:
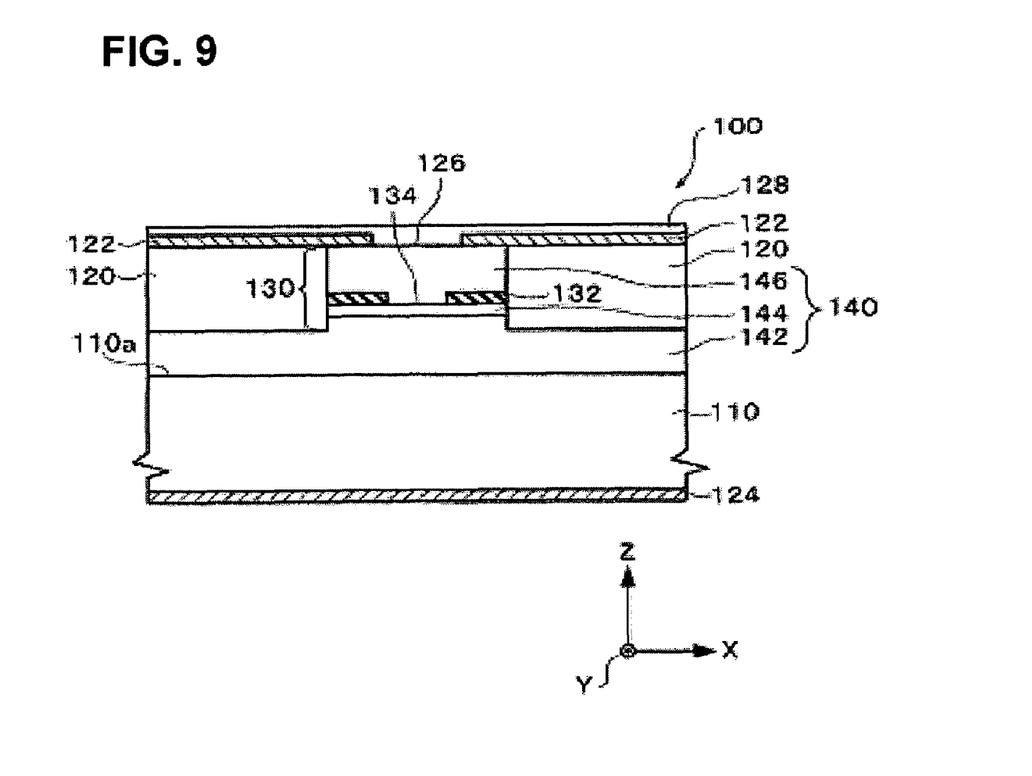
FIG. 9 is a plan view schematically showing a surface-emitting type semiconductor laser in accordance with Modified Example 1.

FIG. 8 and FIG. 9 are cross-sectional views schematically showing a surface-emitting type semiconductor laser in accordance with Modified Example 1. It is noted that FIG. 8 and FIG. 9 are cross-sectional views of the surface-emitting type semiconductor laser in accordance with the Modified Example 1, and correspond to the cross-sectional view shown in FIG. 2.

Modified Example 1 shows an example in which a dielectric film is provided over a first electrode 122 in a manner to cover at least an upper end section thereof on the side of an emission surface 126. FIG. 8 shows a mode in which the dielectric film 128 is provided to cover the first electrode 122. FIG. 9 shows a mode in which the dielectric film 128 is provided to further extend over the emission surface 126. A nitride film or an oxide film may be enumerated as the dielectric film 128.

As shown in FIG. 9, when the dielectric film 128 is provided in a manner to further extend over the emission surface 126, the dielectric film 128 provided above the emission surface 126 may preferably have a film thickness D' shown by the following formula (2).

$$D' = (2i+1)\lambda/4n' \qquad (2)$$

(In the formula (2), i is an integer, λ is an oscillation wavelength, and n' is a refractive index of the dielectric.)

By setting the film thickness of the dielectric film 128 in the range described above, returning light can be reduced. In view of reflection on the upper surface of the dielectric film 128 and reflection on the lower surface of the dielectric film 128, a phase difference between the incidence light and the reflected light becomes to be π in either of the cases. For this reason, the refractive index can be increased with respect to returning light with wavelength λ. As a result, a surface-emitting type semiconductor laser with excellent characteristics with little influence by returning light can be provided.

According to the surface-emitting type semiconductor laser in accordance with Modified Example 1, the upper end section of the first electrode 122 on the side of the emission surface 126 is covered by the dielectric film 128, such that concentration of electric field that would likely occur at a corner section can be alleviated. For this reason, distortion of the mode at the upper end section of the first electrode 122 can be suppressed. As a result, a surface-emitting type semiconductor laser whose radiation angle is reduced can be provided.

2. 2. Modified Example 2

Figure 10:
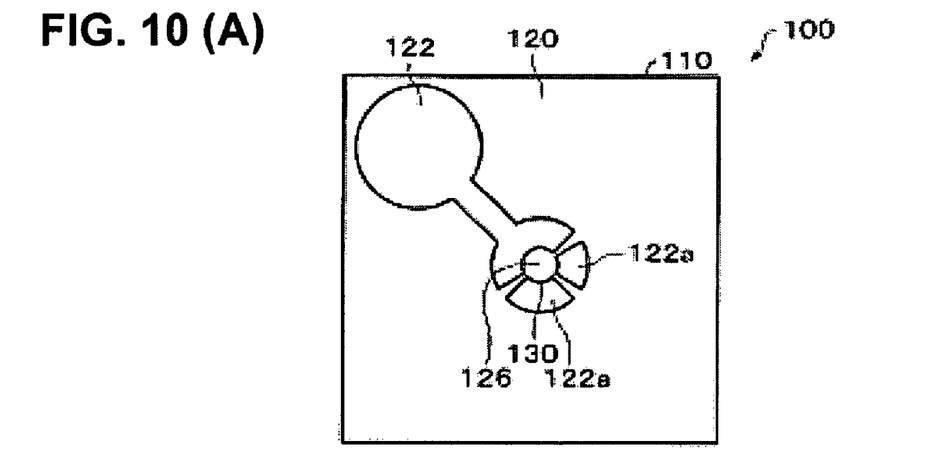
FIG. 10 is a plan view schematically showing a surface-emitting type semiconductor laser in accordance with Modified Example 2.

FIG. 10 (A)-FIG. 10 (C) are plan views showing surface-emitting type semiconductor lasers in accordance with Modified Example 2, and FIG. 10 (A)-FIG. 10 (C) show planes corresponding to FIG. 1.

Modified Example 2 pertains to examples in which the plane configuration of a first electrode 122 is different from the embodiment described above. As shown in FIG. 10 (A)-FIG. 10 (C), the first electrode 122 is formed from a plurality of divided electrodes 122a, which are disposed in a manner that a line connecting end faces of the plurality of divided electrodes 122a on the side of an emission surface 126 defines a ring shape. It is noted here that the ring shape may be a circular shape or a quadrangular shape as viewed in a plan view.

According to the surface-emitting type semiconductor lasers in accordance with Modified Example 2, a part of the divided electrodes 122a may be made as an electrode that does not contribute to current injection, and can be made in a variety of modes, such as, a spare electrode, an electrode of another device to be connected to the surface-emitting type semiconductor laser 100 or the like.

2. 3. Modified Example 3

Figure 11:
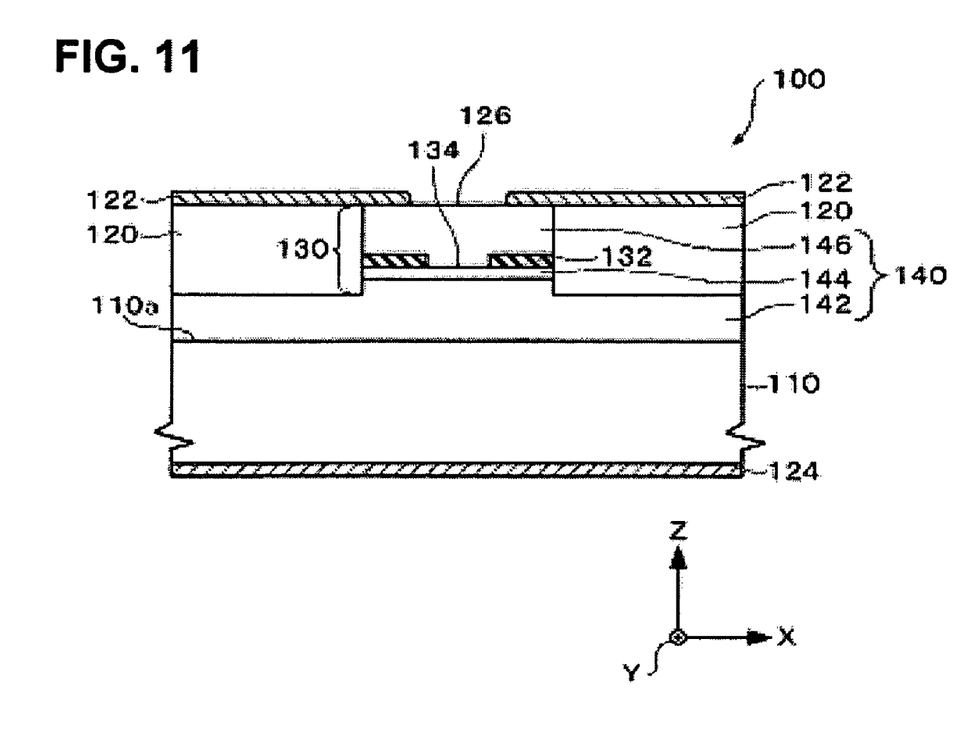
FIG. 11 is a plan view schematically showing a surface-emitting type semiconductor laser in accordance with Modified Example 3.

FIG. 11 is a cross-sectional view schematically showing a surface-emitting type semiconductor laser in accordance with Modified Example 3, and FIG. 11 shows a cross section corresponding to FIG. 2.

Modified Example 3 pertains to an example in which the shape of an upper end section of a first electrode 122 on the side of an emission surface 126 is different from the embodiment described above. As shown in FIG. 11, the first electrode 122 has the upper end section whose cross-sectional shape on the side of the emission surface 126 has a curved profile. FIG. 11 illustrates an example in which the first electrode 122 has a curved profile only at its upper end section, but it can have a cross-sectional shape that is a semicircular shape in accordance with another mode.

According to the surface-emitting type semiconductor laser in accordance with Modified Example 3, concentration of the electric field at the upper end section of the first electrode 122 on the side of the emission surface 126 can be suppressed. For this reason, distortion of the mode at the upper end section of the first electrode 122 can be suppressed like Modified Example 1. As a result, a surface-emitting type semiconductor laser whose radiation angle is reduced can be provided.

It is noted that Modified Examples 1-3 may not necessarily be independent modes as described above, but two or more of the examples among Modified Examples 1-3 may be combined.

The present invention is not limited to the embodiments described above, but can be modified within the scope of the subject matter of the present invention.

What is claimed is:

1. A surface-emitting type semiconductor laser comprising:
   a substrate;
   a first mirror provided above the substrate;
   an active layer provided above the first mirror;
   a second mirror provided above the active layer, the second mirror including an emission surface;
   an electrode provided above the second mirror the electrode covering a portion of the second mirror; and
   a current constricting section above the active layer, wherein a diameter of an aperture defined by the current constricting section is smaller than a diameter of the emission surface,
   wherein the electrode has a film thickness D that satisfies a formula (1) as follows, $$(4i+1)\lambda/8n \leq D \leq (4i+3)\lambda/8n \quad (1)$$

where, in the formula (1), i is an integer, λ is an oscillation wavelength, and n is a refractive index of a material that covers the emission surface, and wherein the difference ΔR between the diameter of the aperture and the diameter of the emission surface is a value that satisfies a formula (2) as follows, $$\Delta R \geq d \times \tan(\theta/2) \quad (2)$$

where, in the formula (2), d is a distance from the active layer to the emission surface, and θ is an angle of broadening of light generated from the emission surface to the active layer.

2. A surface-emitting type semiconductor laser according to claim 1, further comprising a dielectric film that covers at least an upper end section of the electrode on an emission surface side.

3. A surface-emitting type semiconductor laser according to claim 2, wherein the dielectric film covers the upper end section of the electrode on the emission surface side, and further is provided above at least a portion of the emission surface, and the dielectric film that is present above the emission surface has a film thickness D' that is defined by a formula (3) as follows, $$D'=(2i+1)\lambda/4n' \quad (2)$$

where, in the formula (3), i is an integer, λ is an oscillation wavelength, and n' is a refractive index of the dielectric.

4. A surface-emitting type semiconductor laser according to claim 1, wherein the electrode is formed from a plurality of divided electrodes, wherein the plurality of divided electrodes are disposed such that end faces of the eelctrodes on the emission surface define a ring shape.

5. A surface-emitting type semiconductor laser according to claim 1, wherein at least a portion of an end section of a cross section of the electrode on the emission surface side is a curve.

6. A surface-emitting type semiconductor laser according to claim 1, wherein the aperture is positioned inside the emission surface as viewed in a plan view.

7. A surface-emitting type semiconductor laser according to claim 1, further comprising a contact layer provided between the second mirror and the electrode.

8. The surface-emitting type semiconductor laser according to claim 1, the film thickness D being correlated with a radiation angle having a period of $\lambda/2n$.

* * * * *